United States Patent
Klein et al.

(10) Patent No.: US 6,362,684 B1
(45) Date of Patent: Mar. 26, 2002

(54) AMPLIFIER HAVING AN ADJUST RESISTOR NETWORK

(75) Inventors: Hans W. Klein, Danville, CA (US); Jian Li, Portland; Yaohua Yang, West Linn, both of OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/506,180

(22) Filed: Feb. 17, 2000

(51) Int. Cl.$^7$ ................................................ H03G 3/10
(52) U.S. Cl. .......................................... 330/86; 330/282
(58) Field of Search ........................... 330/69, 86, 254, 330/258, 282, 284

(56) References Cited

U.S. PATENT DOCUMENTS

| | | | |
|---|---|---|---|
| 4,250,556 A | 2/1981 | Goser | 364/600 |
| 4,509,021 A | * 4/1985 | van Uden | 330/282 |
| 4,531,113 A | 7/1985 | Abraham | 340/347 C |
| 4,733,205 A | 3/1988 | Hughes | 333/172 |
| 4,801,888 A | 1/1989 | Haque | 330/9 |
| 4,855,685 A | * 8/1989 | Hochschild | 330/282 |
| 4,857,778 A | 8/1989 | Hague | 307/521 |
| 5,068,823 A | 11/1991 | Robinson | 395/500 |
| 5,107,146 A | 4/1992 | El-Ayat | 307/465 |
| 5,196,740 A | 3/1993 | Austin | 307/303 |
| 5,245,262 A | 9/1993 | Moody et al. | 318/560 |
| 5,311,142 A | 5/1994 | Terane et al. | 330/10 |
| 5,416,484 A | 5/1995 | Lofstrom | 341/159 |
| 5,463,349 A | 10/1995 | Peterson et al. | 330/254 |
| 5,554,957 A | 9/1996 | Klein | 330/251 |
| 5,557,234 A | 9/1996 | Collins | 327/563 |
| 5,574,678 A | 11/1996 | Gorecki | 364/807 |
| 5,608,345 A | 3/1997 | Macbeth et al. | 327/337 |
| 5,625,316 A | 4/1997 | Chambers et al. | 327/553 |
| 5,625,361 A | 4/1997 | Garrity et al. | 341/172 |
| 5,680,070 A | 10/1997 | Anderson et al. | 327/336 |
| 5,821,776 A | 10/1998 | McGowan | 326/41 |
| 5,877,612 A | 3/1999 | Straw | 330/254 |
| 5,905,398 A | 5/1999 | Todsen et al. | 327/337 |
| 5,912,567 A | 6/1999 | Drost et al. | 327/89 |
| 5,914,633 A | 6/1999 | Comino et al. | 327/553 |
| 5,952,952 A | 9/1999 | Choi et al. | 341/172 |
| 5,959,871 A | 9/1999 | Pierzchala et al. | 364/489 |
| 5,966,047 A | 10/1999 | Anderson et al. | 327/565 |
| 6,013,958 A | 1/2000 | Aytur | 307/109 |
| 6,014,097 A | 1/2000 | Brandt | 341/156 |
| 6,111,437 A | 8/2000 | Patel | 327/74 |
| 6,137,365 A | * 10/2000 | Wakairo et al. | 330/282 |

FOREIGN PATENT DOCUMENTS

| | | |
|---|---|---|
| EP | 0322382 B1 | 9/1994 |
| EP | 0871223 A1 | 10/1998 |
| EP | 0611165 B1 | 7/1999 |
| WO | WO 98/21726 | 5/1998 |

OTHER PUBLICATIONS

Maxim Integrated Products, "Digitally–Programmed, Dual $2^{nd}$ Order Continuous Lowpass Filters," Aug. 1997, pp. 1–16.

(List continued on next page.)

*Primary Examiner*—Steven J. Mottola
(74) *Attorney, Agent, or Firm*—Skjerven Morrill MacPherson LLP

(57) ABSTRACT

Provided is an amplifier circuit and method of using the same that features an adjustable resistor network to enable varying the operational characteristics of an amplifier. The resistor network includes primary resistors connected in series with a plurality of adjustment resistors connected to the output of an operational amplifier. A switching network is connected between the resistor network and the input of the operational amplifier. The switching network enables selectively varying the input and feedback resistance of the amplifier circuit to obtain a desired differential gain, while minimizing common-mode gain.

11 Claims, 6 Drawing Sheets

OTHER PUBLICATIONS

Massimo A. Sivolotti, "A Dynamically Configurable Architecture For Prototyping Analog Circuits," Mar. 1998, pp. 237–258.

Edward K. F. Lee and P. G. Gulak, "Prototype Design of a Field Programmable Analog Array," Aug. 30, 1990, pp. 2.2.1–2.2.8.

Edward K. F. Lee and P. Glenn Gulak, "A CMOS FieldProgrammable Analog Array," *IEEE Journal Of SolidState Circuits*, vol. 26, No. 12, Dec. 1991, pp. 1860–1867.

Frank Goodenough, "Analog Counterparts Of FPGAS Ease System Design," *Electronic Design*, Oct. 14, 1994.

IMP, Inc., Preliminary Product Information, IMP50E10 EPAC™ (Electrically Programmable Analog Circuit), Nov. 1994, pp. 1–16.

"*Analog–Digital Conversion Handbook*"; by the Engineering Staff of Analog Devices, Inc.; Edited by Daniel H. Sheingold; Prentice–Hall, Englewood Cliffs, NJ; p. 596.

* cited by examiner

Key To

| FIG. 3A |
| FIG. 3B |

AMPLIFIER HAVING AN ADJUST RESISTOR NETWORK

BACKGROUND OF THE INVENTION

1. Field of the Invention

The present invention relates to amplifier circuits. More particularly, the present invention is directed to a resistor network suited for operational amplifiers.

2. Description of the Related Art

The operational amplifier is a basic analog building block common to various electronic functions performed in instrumentation, computation and control circuits. A design of operational amplifier that facilitates sensing desired signals embedded in noise signals is known as a differential operational amplifier.

Referring to FIG. 1, a conventional operational amplifier 10 includes a first input $In_1$, a second input $In_2$, a first output, $Out_1$, and a second output, $Out_2$. The amplifier 10 facilitates discrimination between desired signals from noise signals by amplifying the differential signals applied to the first and second inputs $In_1$, and $In_1$. The noise signals that are common to both inputs, $In_1$, and $In_2$, i.e., common-mode signals are rejected. The effectiveness of the amplifier to reject common-mode signals is usually measured as a ratio of differential voltage gain to the common-mode voltage gain, referred to as the common-mode rejection ratio (CMRR).

Both the differential gain and CMRR are a function of the resistor networks 30a and 30b. Each of the resistor networks 30a and 30b include a feedback resistor 32a, 32b, respectively. An input resistor 34a and 34b is also included in each resistor network 30a and 30b, respectively. The differential gain, $A_D$, is defined as follows:

$$A_D = R_{FEEDBACK}/R_{INPUT} \quad (1)$$

where $R_{FEEDBACK}$ corresponds to resistors 32a and 32b and $R_{INPUT}$ corresponds to resistors 34a and 34b. As discussed above, the CMRR is defined as follows:

$$CMRR = A_D/A_{cm} \quad (2)$$

where $A_{CM}$ is the common-mode gain. The $A_{CM}$ is, however, approximated as follows:

$$A_{CM} [(\Delta R_{INPUT}/R_{INPUT}) - (\Delta R_{FEEDBACK}/R_{FEEDBACK})] \quad (3)$$

where $\Delta R_{INPUT}$=(value of resistor 34b–value of resistor 34a) and $\Delta R_{FEEDBACK}$=(value of resistor 32b–value of resistor 32a). From the foregoing, it is seen that precise control of the CMRR, differential gain, $A_D$, and common-mode gain $A_{CM}$ requires accurate control of the values of the $R_{FEEDBACK}$ and $R_{INPUT}$ resistors.

What is needed, therefore, is an amplifier that facilitates precise control of the resistors included in the resistor network associated therewith.

SUMMARY OF THE INVENTION

Provided is a circuit and method for operating the same that features an adjustable resistor network to enable varying the operational characteristics of an amplifier. To that end, the resistor network includes primary resistors connected in series with a plurality of adjustment resistors connected to the output of an operational amplifier. A switching network is connected between the resistor network and the input of the operational amplifier. The resistor network includes a feedback resistor and an input resistor, with the feedback resistor being coupled between the output and the input of the operational amplifier. The input resistor includes a primary input resistor and a plurality of input adjustment resistors connected in series with the primary input resistor. The feedback resistor includes a primary feedback resistor and a plurality of feedback adjustment resistors connected in series with the primary feedback resistor. The switching network includes a plurality switches, each of which has a signal input and a signal output. The signal outputs of a subset of the plurality of switches are connected in common with the input of the operational amplifier. Each of the inputs of the subgroup of the plurality of switches is connected to one of either the input adjustment resistors or the feedback adjustment resistors. With this configuration, the value of both the input and feedback resistors may be varied/defined by selectively connecting the adjustment resistors to the operational amplifier input.

An additional embodiment of the operational amplifier includes two inputs and two outputs. A first resistor network is provided that is connected to one of the outputs, with a first switching network connected between the first resistor network and one of the inputs. The remaining output is connected to a second resistor network, with a second switching network connected between the second resistor network and the remaining input. Each of the first and second resistor networks includes an input resistor and a feedback resistor, as discussed above. The first and second switching networks each includes a plurality of switches connected to vary the value of the input resistor and the feedback resistors, as discussed above.

The primary resistors have a value, R, associated therewith, and the adjustment resistors having a combined value, r, associated therewith. Typically, the value of r is in the range of R/100 to R/1000, inclusive. The actual value of the primary resistors are dependent upon the desired gain of the amplifier. In one example the output of the amplifier is ⅓ of the input, providing a gain of ⅓. To minimize gain drift of the operational over, the ratio of feedback adjustment resistors to input adjustment resistors is directly proportional to the differential gain $A_D$.

In operation, the resistance of the input and feedback resistors is dependent upon the operational characteristics desired. In the present example, the important characteristics are the common-mode gain, $A_{CM}$, and differential gain, $A_D$. Usually, the common-mode gain is established by selectively placing in electrical communication with an input of the operational amplifier, one or more of the adjustment resistors.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 2:
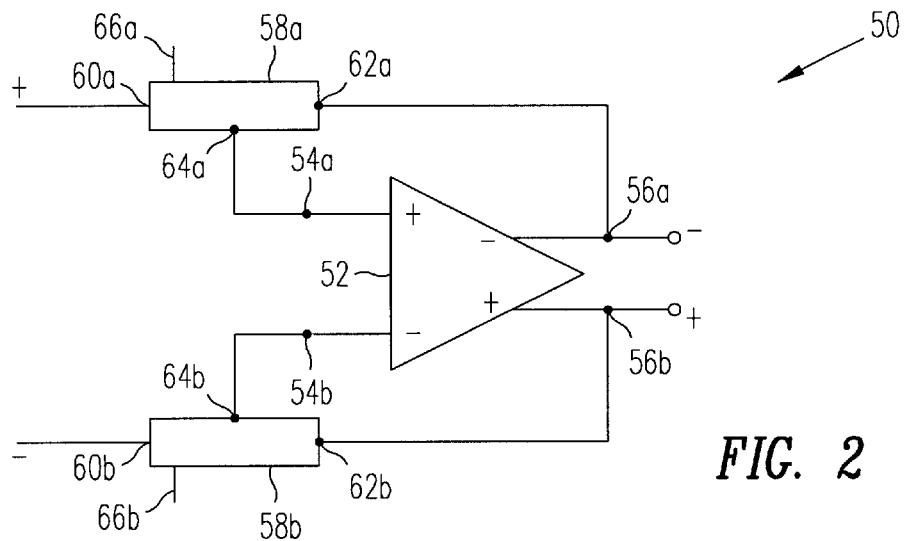
FIG. 2 is a simplified schematic of a differential amplifier in accordance with the present invention.

Referring to FIG. 2, an amplifier circuit 50 includes an operational amplifier 52 having two differential inputs 54a and 54b and two differential outputs 56a and 56b. Connected between the differential input 54a and the differential output 56a is a first tuning circuit 58a. A second tuning circuit 58b is connected between the differential input 54b and the differential output 56b. Each of the tuning circuits have two signal inputs, one control input and a signal output. Specifically, the first tuning circuit 58a includes signal inputs 60a and 62a, signal output 64a, as well as control input 66a. The second tuning circuit 58b includes signal inputs 60b and 62b, signal output 64b, as well as control input 66b.

The first and second tuning circuits 58a and 58b facilitate control of the operational characteristics of the amplifier 50, such as the differential gain, $A_D$, the common-mode gain, $A_{CM}$ and, therefore, the common-mode rejection ratio, CMRR. This is achieved by selectively defining/varying the resistance associated with the differential inputs 54a and 54b and the differential outputs 56a and 56b in accordance with control signals transmitted to control inputs 66a and 66b. In this manner, the CMRR of the amplifier 50 may be controlled by compensating for mismatches in the resistance values between the differential inputs 54a and 54b, as well as the mismatches in the resistance values between the differential outputs 56a and 56b, as well as non-ideal common-mode rejection of the operational amplifier 52.

Figure 1:
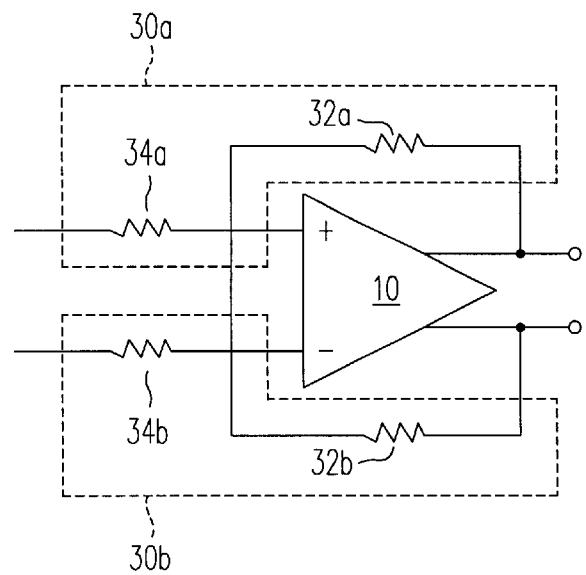
FIG. 1 is a schematic of a prior art operational amplifier.
Figures 3, 3B:
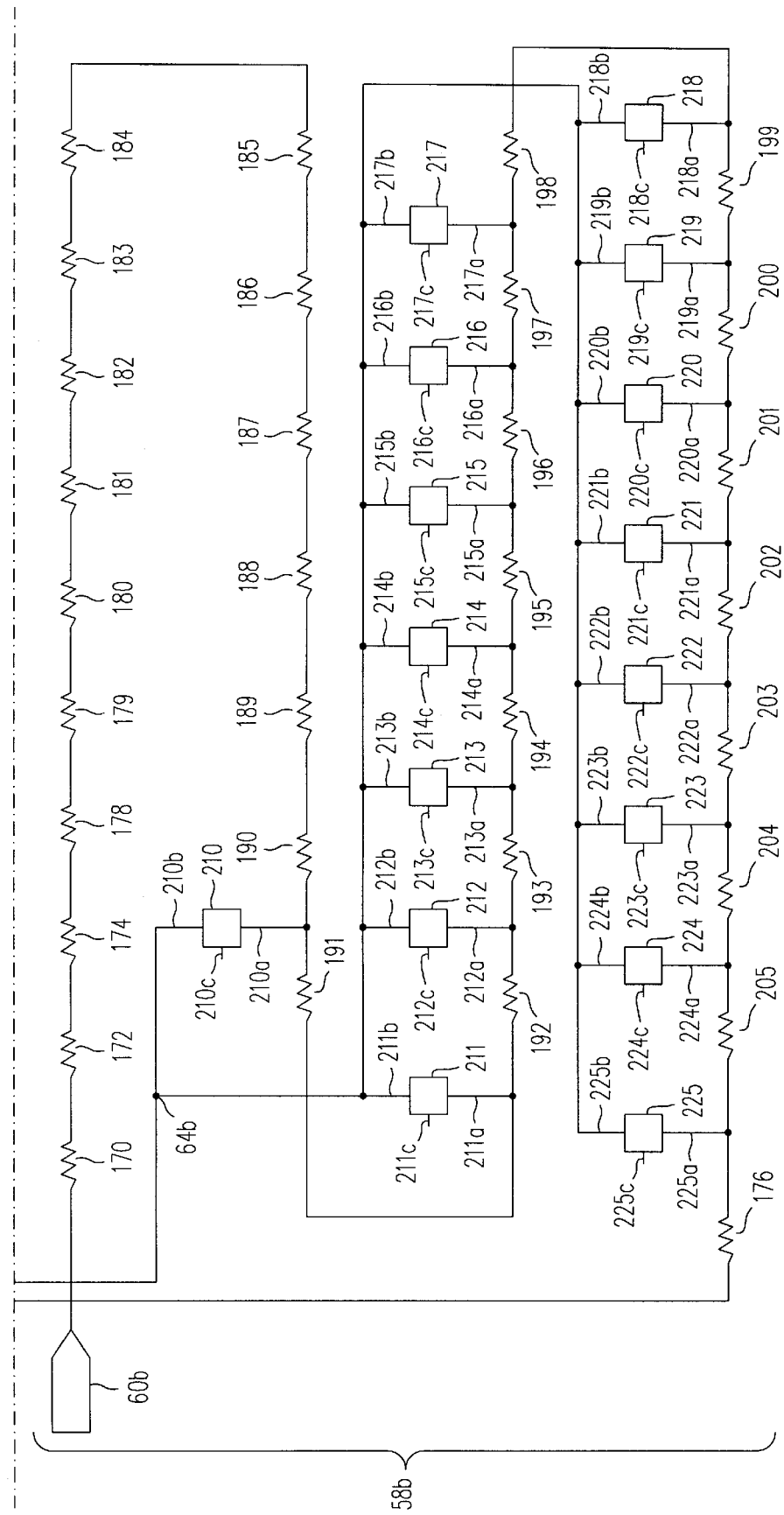
FIG. 3 is a detailed schematic of the differential amplifier shown above in FIG. 2.
Figure 3A:
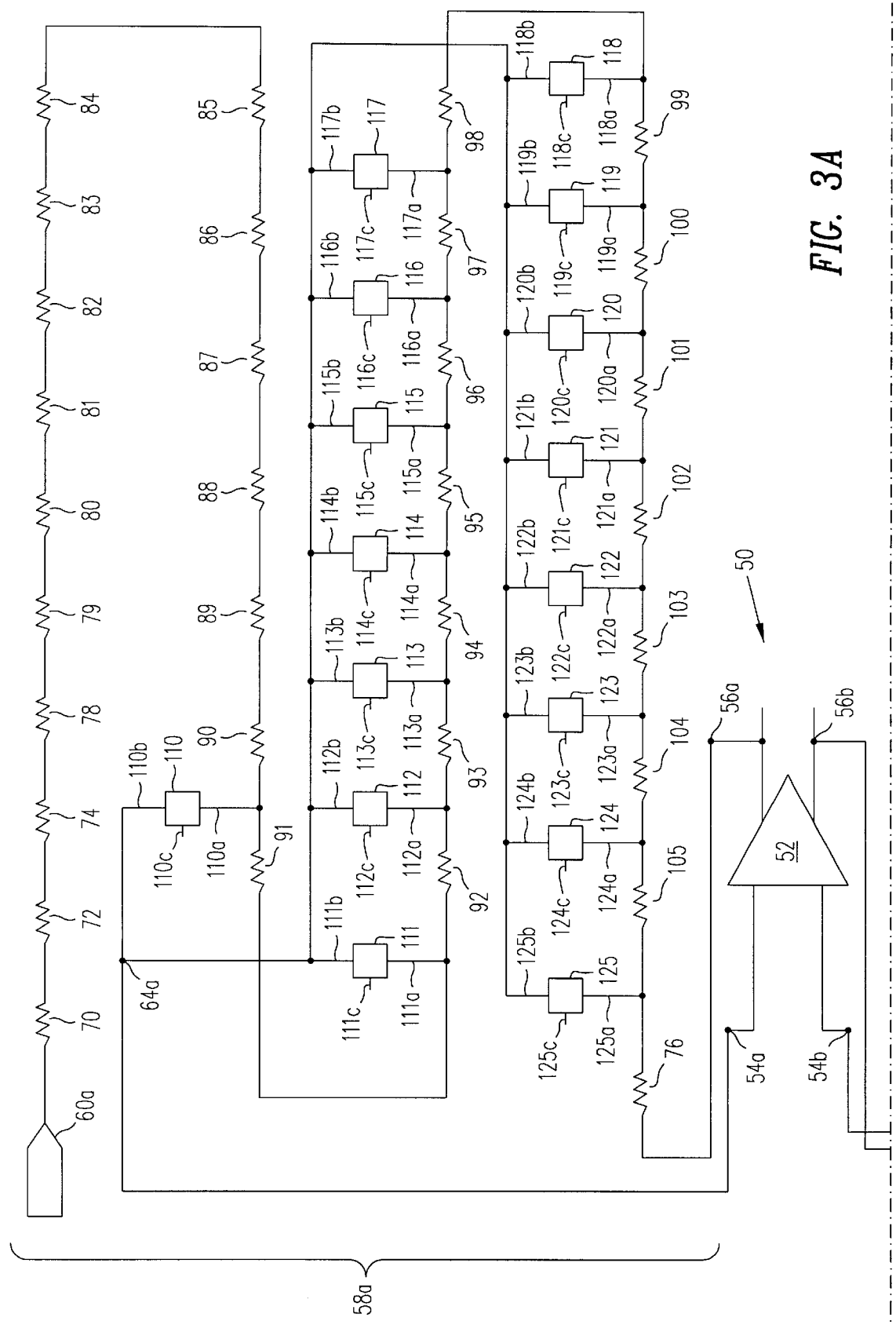

Referring to FIGS. 1, 2 and 3, control over the resistance values at the differential inputs 54a and 54b, referred to herein as the input resistance, and the resistance at the differential outputs 56a and 56b, referred to herein as the feedback resistance, is achieved by including, within each of the adjusting circuits 58a and 58b, a resistor network and a switching network. With respect to adjusting circuit 58a, the resistor network includes a plurality of primary resistors 70, 72, 74 and 76 and a plurality of adjustment resistors 78–105 connected in series between the signal input 60a and the signal inputs 62a, defining a first resistor network. Specifically, primary resistor 70 is connected to the signal input 60a, and primary resistor 76 is connected to signal input 62a, with primary resistors 72 and 74 and adjustment resistors 78–105 connected therebetween.

The switching network includes a plurality switches 110–125 connected between the resistor network and the signal output 64a. Specifically, each of the plurality of switches 110–125 includes a signal input 110a, 111a, 112a, 113a, 114a, 115a, 116a, 117a, 118a, 119a, 120a, 121a, 122a, 123a, 124a, 125a, respectively; and a signal output 110b, 111b, 112b, 113b, 114b, 115b, 116b, 117b, 118b, 119b, 120b, 121b, 122b, 123b, 124b, 125b, respectively. Also included in each of the plurality of switches 110–125 is a control input 110c, 111c, 112c, 113c, 114c, 115c, 116c, 117c, 118c, 119c, 120c, 121c, 122c, 123c, 124c and 125c, respectively.

The signal inputs 110a, 111a, 112a, 113a, 114a, 115a, 116a, 117a, 118a, 119a, 120a, 121a, 122a, 123a, 124a, 125a are connected to one of the input adjustment resistors. Specifically, excepting switch 125 that has a signal input 125a connected in common to primary resistor 76 and adjustment resistor 105, the signal inputs 110a, 111a, 112a, 113a, 114a, 115a, 116a, 117a, 118a, 119a, 120a, 121a, 122a, 123a, 124a of the remaining switches 110–124 are connected in common with a pair of the adjustment resistors 78–105. In this manner, each of the switches 110–125 is associated with a pair of the adjustment resistors 78–105. The signal inputs 110a, 111a, 112a, 113a, 114a, 115a, 116a, 117a, 118a, 119a, 120a, 121a, 122a, 123a, 124a are connected so that a pair of adjustment resistors 78–105 associated with one of the switches 110–125 differs from the pair of adjustment resistors associated with the remaining switches 110–125. With this configuration, the value of the feedback resistance and the input resistance may be defined/varied by selectively activating one of the aforementioned switches, discussed more fully below.

The signal outputs 110b, 111b, 112b, 113b, 114b, 115b, 116b, 117b, 118b, 119b, 120b, 121b, 122b, 123b, 124b, 125b are connected in common with the signal output 64a of the adjustment circuit 58a and, therefore, the differential input 54a of the operational amplifier 52. The control inputs 110c, 111c, 112c, 113c, 114c, 115c, 116c, 117c, 118c, 119c, 120c, 121c, 122c, 123c, 124c and 125c are coupled to the control input 66a through addressing circuitry (not shown) to facilitate selective operation of the switches 110–125.

Similar to adjustment circuit 58a, the resistor network of adjustment circuit 58b includes a plurality of primary resistors 170, 172, 174 and 176 and a plurality of adjustment resistors 178–205. The primary resistors 170, 172, 174 and 176 and the adjustment resistors 178–205 are connected in series between the signal input 60b and the signal inputs 62b, defining a second resistor network. Specifically, the primary resistor 170 is connected to the signal input 60b, and primary resistor 176 is connected to signal input 62b, with primary resistors 172 and 174 and adjustment resistors 178–205 connected therebetween.

The second switching network that is associated with adjustment circuit 58b includes a plurality switches 210–225 connected between the resistor network and the signal output 64b. Specifically, each of the plurality of switches 210–225 includes signal input 210a, 211a, 212a, 213a, 214a, 215a, 216a, 217a, 218a, 219a, 220a, 221a, 222a, 223a, 224a, 225a, respectively; and a signal output 210b, 211b, 212b, 213b, 214b, 215b, 216b, 217b, 218b, 219b, 220b, 221b, 222b, 223b, 224b, 225b, respectively. Also included in each of the plurality of switches 210-225 is a control input 210c, 211c, 212c, 213c, 214c, 215c, 216c, 217c, 218c, 219c, 220c, 221c, 222c, 223c, 224c and 225c, respectively.

The signal inputs 210a, 211a, 212a, 213a, 214a, 215a, 216a, 217a, 218a, 219a, 220a, 221a, 222a, 223a, 224a, 225a are connected to one of the input adjustment resistors. Specifically, excepting switch 225 that has a signal input 225a connected in common to primary resistor 176 and adjustment resistor 205, the signal inputs 210a, 211a, 212a, 213a, 214a, 215a, 216a, 217a, 218a, 219a, 220a, 221a, 222a, 223a, 224a of the remaining switches 210–224 are connected in common with a pair of the adjustment resistors 178–205. In this manner, each of the switches 210–225 is associated with a pair of the adjustment resistors 178–205. The signal inputs 210a, 211a, 212a, 213a, 214a, 215a, 216a, 217a, 218a, 219a, 220a, 221a, 222a, 223a, 224a are connected so that pair of adjustment resistors 178–205 associated with one of the switches 210–225 differs from the pair of adjustment resistors associated with the remaining switches 210–225.

The signal outputs are connected as discussed with respect to 210b, 211b, 212b, 213b, 214b, 215b, 216b, 217b, 218b, 219b, 220b, 221b, 222b, 223b, 224b, 225b, but are connected in common with the signal output 64b of the adjustment circuit 58b and, therefore, the differential input 54b of the differential amplifier 52. The control inputs 210c, 211c, 212c, 213c, 214c, 215c, 216c, 217c, 218c, 219c, 220c, 221c, 222c, 223c, 224c and 225c are coupled to the control input 66b through addressing circuitry (not shown) to facilitate selective operation of the switches 210–225.

As mentioned above, the value of the feedback resistance and the input resistance may be defined/varied by selectively activating one of the aforementioned switches. For example, to establish both the input and feedback resistance, a signal at control input 218c would activate switch 218, allowing a signal to propagate between the signal input 218a and the signal output 218b. This places resistors 170, 172, 174 and adjustment resistors 178–198 in the input signal path, i.e., coupling the same to the differential input 54b of the amplifier 52. Activation of switch 218 also establishes the feedback resistance and places resistor 176, as well as adjustment resistors 199–205 in the feedback signal path. Were it desired to increase the feedback resistance and decrease the input resistance, switch 218 would be de-activated and one of the remaining switches 210–217 would be activated. In a similar manner, the resistance may be established for the adjustment circuit 58a.

Figure 4:
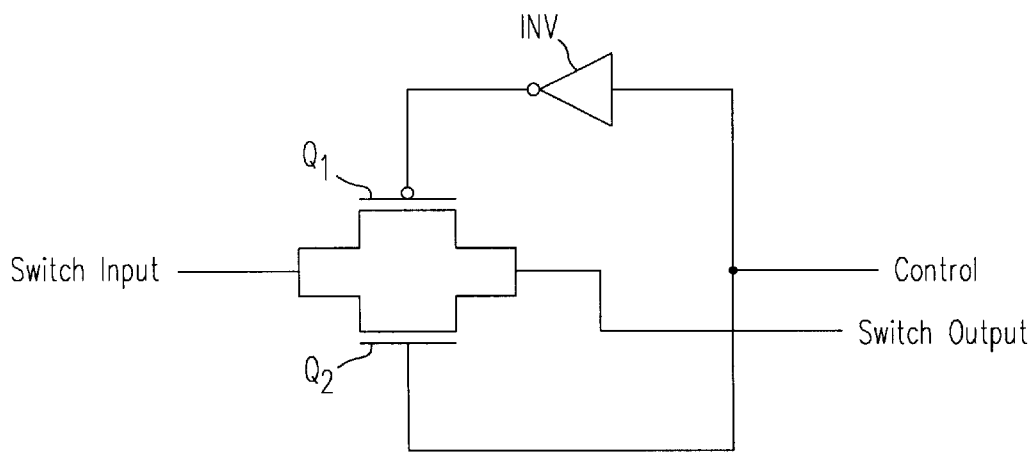
FIG. 4 is a schematic of switches shown above in FIG. 3, in accordance with the present invention.

Referring to FIG. 4, each of the switches 110–125 and 210–225 is formed using CMOS technology. To that end, each of the switches 110–125 and 210–225 includes a p-channel field effect transistor $Q_1$ and an n-channel field effect transistor $Q_2$ having the sources and drains connected together defining a signal input and a signal output. The control input is defined by connecting the gates of $Q_1$ and $Q_2$ together through an inverter INV.

Referring again to FIGS. 2 and 3, the primary resistors 70, 72, 74, 76 170, 172, 174 and 176 each have a nominal value associated therewith that provides the desired operational characteristics of the amplifier 52. In the present example, the primary resistors 70, 72 and 74 define the nominal input resistance, $R_1$, for differential input 54a, and the primary resistors 170, 172 and 174 define the nominal input resistance $R_1'$ for differential input 54b. The primary resistor 76 defines the nominal feedback resistance, $R_2$, associated with the differential output 56a, and the primary resistor 176 defines the nominal feedback resistance $R_2'$ associated with the differential output 56b. The primary resistors 70, 72, 74, 76, 170, 172, 174 and 176 are approximately the same value providing the amplifier with a differential gain, $A_D$, of ⅓, that is, $R_3=1R_2$ and $R_1'=3R_2'$. To increase the accuracy of the differential gain $A_D$ and to reduce the common-mode gain, $A_{CM}$, however, the adjustment resistors 78–105 and 178–205 each have a resistance that is substantially less than the primary resistors 70, 72, 74, 76, 170, 172, 174 and 176. This facilitates incremental adjustments to the resistance associated with the resistor networks of each of the adjustment circuits 58a and 58b.

The value of each of the adjustment resistors 78–105 and 178–205 is determined assuming that each contributes to either the input resistance or the feedback resistance. To that end, the combined resistance of adjustment resistors 78–105, $r_{ad1}$, contributes an adjustment resistance to the differential input 54a having a value $rt_1$, as well as an adjustment resistance to the differential output 56a having a value $rt_2$. This may be stated as follows:

$$r_{ad1} = rt_1 + rt_2, \quad (4)$$

Similarly, the combined value for adjustment resistors 178–205, $r_{ad2}$, may be stated as follows:

$$r_{ad2} = rt_1' + rt_2', \quad (5)$$

From equation (4) the total value, $Rt_1$, of the input resistance $R_1$ at the differential input 54a and the total value, $Rt_2$, of the feedback resistance, $R_2$, at the differential output 56a may be determined as follows:

$$Rt_1 = R_1 + x; \text{ and} \quad (6)$$

$$Rt_2 = R_2 - x, \quad (7)$$

where x is the incremental change in resistance provided by one or more of the adjustment resistors 78–105. In a similar manner the total value, $Rt_1'$, of the input resistance $R_1'$, at the differential input 54b and the total value, $Rt_2'$ of the feedback resistance, $R_2'$, at the differential output 56b may be determined from equation (5) as follows:

$$Rt_1' = R_1' + y; \text{ and} \quad (8)$$

$$Rt_2' = R_2' - Y, \quad (9)$$

where y is the incremental change in resistance provided by one or more of the adjustment resistors 178–205. From equations (3), and (6)–(9) we find that the common-mode gain, $A_{CM}$, with the aforementioned adjustment resistors is defined as follows:

$$A_{CM} = ¾[(\Delta Rt_1/R_1) - (\Delta Rt_2/R_2) + (4(x-y)/3R_2)] \quad (10)$$

where $\Delta Rt_1 = (Rt_1 - Rt_1)$ and $\Delta Rt_2 = (Rt_2 - Rt_2)$. From equation (10), the minimum trim range, $t_{min}$, for a 2% mismatch between $Rt_2$ and $Rt_2'$ is determined as follows:

$$t_{min} = (4(x-y)/3R_2) = (0.02 + 0.02) = 0.04 \quad (11)$$

that provides $$t_{min} = (x-y)/R_2 = 0.03, \quad (12)$$

Assuming $R_2 = 3,375$ ohms, we find that the minimum value of the trim range for the adjustment resistors 78–105 and 178–205 should be at least 101.3 ohms. This would provide sufficient adjustment to reduce the common-mode gain, $A_{CM}$, to a desired level, if not zero. To determine the minimum value of the individual adjustment resistors to provide a CMRR of at most –50 dB, we find that the common mode gain, in the present example, can be no greater than 0.002. From equation (10) we find as follows:

$$-0.002 < A_{CM} = ¾[(\Delta Rt_1/R_1) - (\Delta Rt_2/R_2) + (4(x-y)/3R_2)] < 0.002 \quad (13)$$

This provides a minimum value, $r_{CMmin}$ for the individual adjustment resistors 78–105 and 178–205 to be as follows:

$$(x-y)/R_2 = 0.004 \quad (14)$$

For $R_2$ being 3,375 ohms, equation (14) dictates that the minimum value of the adjustment resistors, $r_{CMmin}$ be approximately 13.5 ohms.

After determining $r_{CMmin}$ for correction of $A_{CM}$, the value of the individual adjustment resistors is determined to correct for a desired level of differential gain $A_D$ error. To correct for a 4% error in the differential gain, it was determined that $r_{min}$ is fixed at approximately 14.5 ohms. With that value the CMRR may be reduced to be at most –54 dB, while providing satisfactory differential gain $A_D$.

Figure 5:
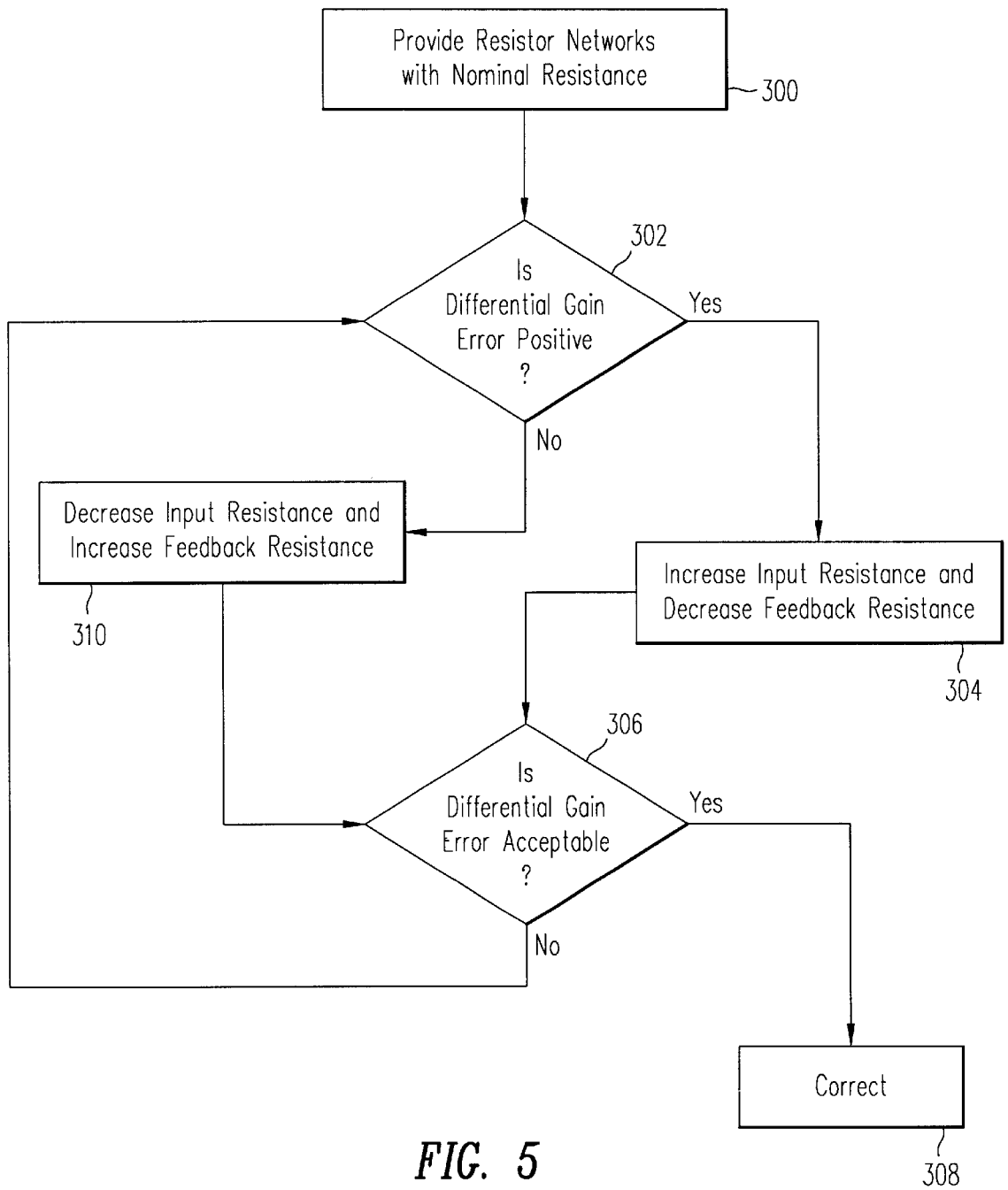
FIG. 5 is a flow diagram showing a method of controlling the differential gain of the amplifier shown in above in FIGS. 2 and 3, in accordance with the present invention.

Referring to both FIGS. 3 and 5 to provide the requisite resistance to the adjustment circuits 58a and 58b, all switches are deactivated, excepting switches 118 and 218, referred to as the nominal resistance at step 300. Thereafter, were it determined that the differential gain, $A_D$, error was positive at step 302, then the resistance value $R_1$ and $R_1'$ could be increased concurrently with a decrease in resistance value $R_2$ and $R_2'$ at step 304. This would result in about 0.57% incremental change in differential gain, $A_D$. If necessary, steps 302 and 304 would be repeated until the gain error was substantially reduced, by determining at step 306 whether the differential gain $A_D$ is acceptable. Were the differential gain $A_D$ found to be acceptable at step 306, then common-mode $A_{CM}$ gain error may be achieved in a similar manner by increasing the resistance value $R_1'$, while decreasing the resistance value $R_1$ to adjust common-mode gain, $A_{CM}$. Alternatively, correction of common-mode gain, $A_{CM}$, error may be achieved by decreasing $R_1'$, while increasing the resistance value $R_1$. Correction of common-mode gain $A_{CM}$ error allows correction of CMRR and occurs following step 308, discussed more fully below.

Figure 6:
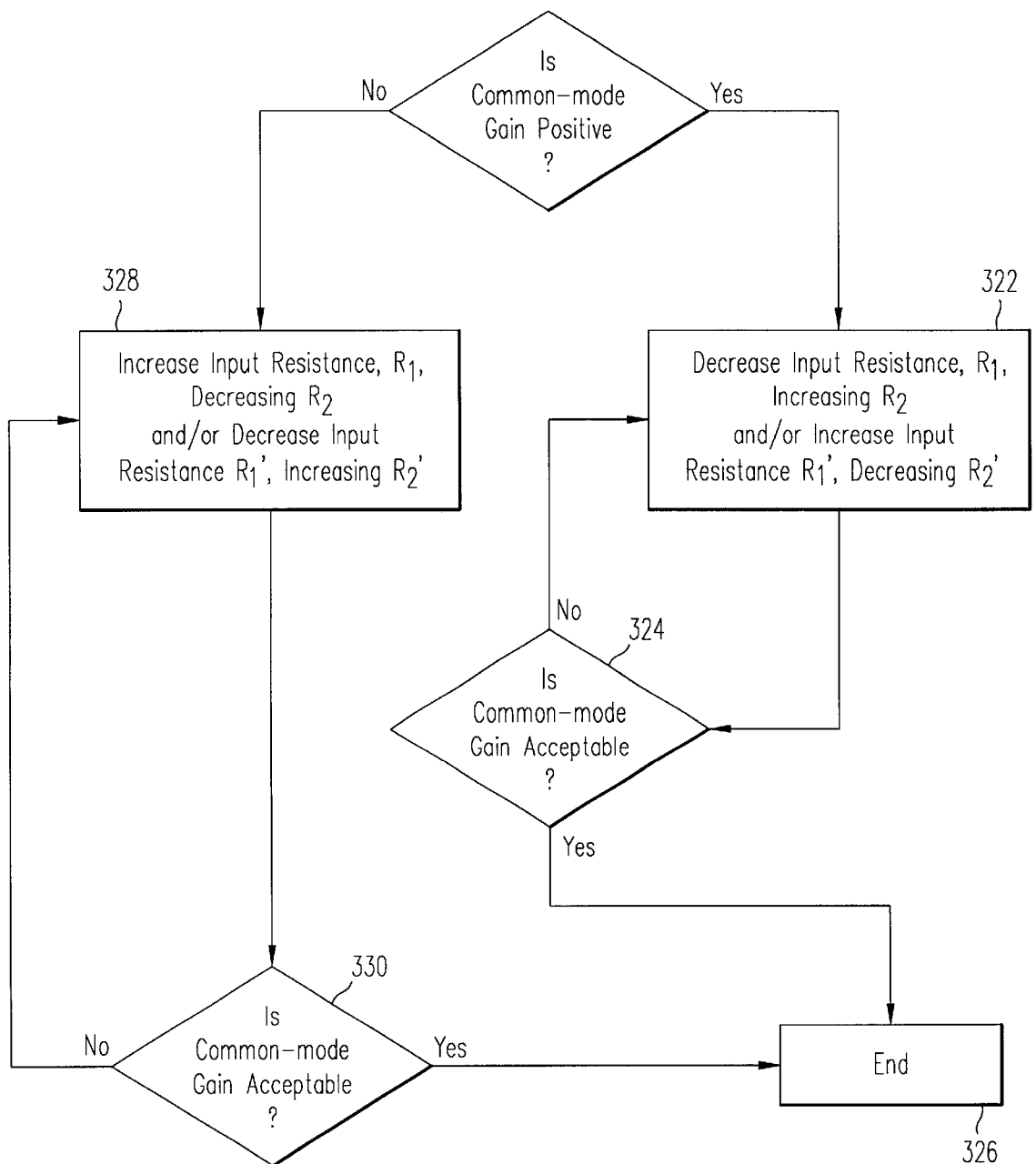
FIG. 6 is a flow diagram showing a method of controlling the common-mode gain of the amplifier shown in above in FIGS. 2 and 3, in accordance with the present invention.

Referring to both FIGS. 2 and 6, common-mode gain, $A_{CM}$, the CMRR is reduced at step 308 to the desired level in accordance with the following equation:

$$\Delta = \text{Int}[A_{CMNONTRIM}(R_2''/r_{adj})] \qquad (15)$$

where the variable $\Delta$ indicates an integer-change in the number of adjustment resistors associated with the input resistance and feedback resistance of one of the adjustment circuits 58a and 58b. The variable Int defines a function to obtain a whole integer number from the results obtained from the variables $A_{CMNONTRIM}$ $(R_2''/r_{adj})$. The variable $A_{CMNONTRIM}$ is the measured common-mode gain at the differential outputs 56a and 56b after correction of the differential gain error $A_D$ had been adjusted, but before minimizing common-mode gain $A_{CM}$. The variable $R_2''$ is the nominal value of the feedback resistance $R_2$ and $R_2'$ in each of the adjustment circuits 58a and 58b. The variable $r_{adj}$ is the nominal value for each of the adjustment resistors 78–105 and 178–205.

Referring to both FIGS. 5 and 6, step 308 includes several steps, such as step 320 where it is determined whether the value of $A_{CMNONTRIM}$ is positive, i.e., whether the common-mode gain, $A_{CM}$, is positive. Were it determined that the value of the common-mode gain, $A_{CM}$, is positive, then the adjustment would consist of decreasing the resistance value $R_1$ concurrently with an increase in resistance value $R_2$ by deactivating switch 118 and activating switch 117 at step 322. Alternatively, or in conjunction with that adjustment of resistance values $R_1$ and $R_2$, the resistance value $R_1'$ could be increased concurrently with a decrease in resistance value $R_2'$ at step 322 to minimize the common-mode gain, $A_{CM}$. At step 324 it would be determined whether the common-mode gain, $A_{CM}$, were acceptable after the initial adjustment at step 322. Were it found to be unacceptable, then step 322 would be repeated. Were the common-mode gain, $A_{CM}$ found to be acceptable, then the process would end at step 326.

Were it determined, at step 320, that the value of the common-mode gain, $A_{CM}$, were not positive, i.e., negative, then the adjustment would result in an increase in the resistance value $R_1$ and a decrease in the resistance value $R_2$. Alternatively, or in conjunction with the adjustment of resistance values $R_1$ and $R_2$, the value of the common-mode gain, $A_{CM}$, may be adjusted by decreasing $R_1'$ and increasing $R_2'$ at step 328. At step 330 it would be determined whether the common-mode gain, $A_{CM}$ were acceptable after the initial adjustment at step 328. Were it found not to be acceptable, then step 328 would be repeated. Were the common-mode gain, $A_{CM}$, found to be acceptable, then the process would end at step 326.

For example, were the value $R_2''$ approximately 3,375 ohms and the value of $r_{adj}$ approximately 14.5 ohms and $A_{CMNONTRIM}$ approximately 0.01, then $\Delta$ would be 2. This indicates that the resistance value $R_1$ could be decreased by a value $r_{adj}$ and the value $R_2$ could be increased by the same amount. Were the value $R_2''$ approximately 3,375 ohms and the value of $r_{adj}$ approximately 14.5 ohms and $A_{CMNONRIM}$ approximately −0.022, then $\Delta$ would be −5. This indicates that the resistance value $R_1$ could be increased by a value $3r_{adj}$ and the value $R_2$ could be decreased by the same amount. Were the common-mode gain, $A_{CM}$, determined to be acceptable, then the value of $R_1$ and $R_2$ would be adjusted as discussed above by an amount $r_{adj}$. This would be repeated until the common-mode gain, $A_{CM}$, was acceptable. In this manner, a reduction in CMRR may be maximized while minimizing the change in differential gain, $V_D$. The aforementioned corrections to the resistors is typically performed employing a tester manufacture by Hewlett-Packard under model number HP9492.

A problem encountered with the present invention concerns the stability of the resistance values when the circuit is subjected to differing thermal environments. As a result, it was found that the differential gain, $A_D$, the common-mode gain, $A_{CM}$, and, therefore, the CMRR may be maintained during thermal cycling by ensuring that the ratio of feedback resistance provided, by the adjustment resistors, to the input resistance, provided by the adjustment resistors, be directly proportional to the differential gain $A_D$. To that end, there are three times the number of input adjustment than there are feedback adjustment resistors.

Figure 7:
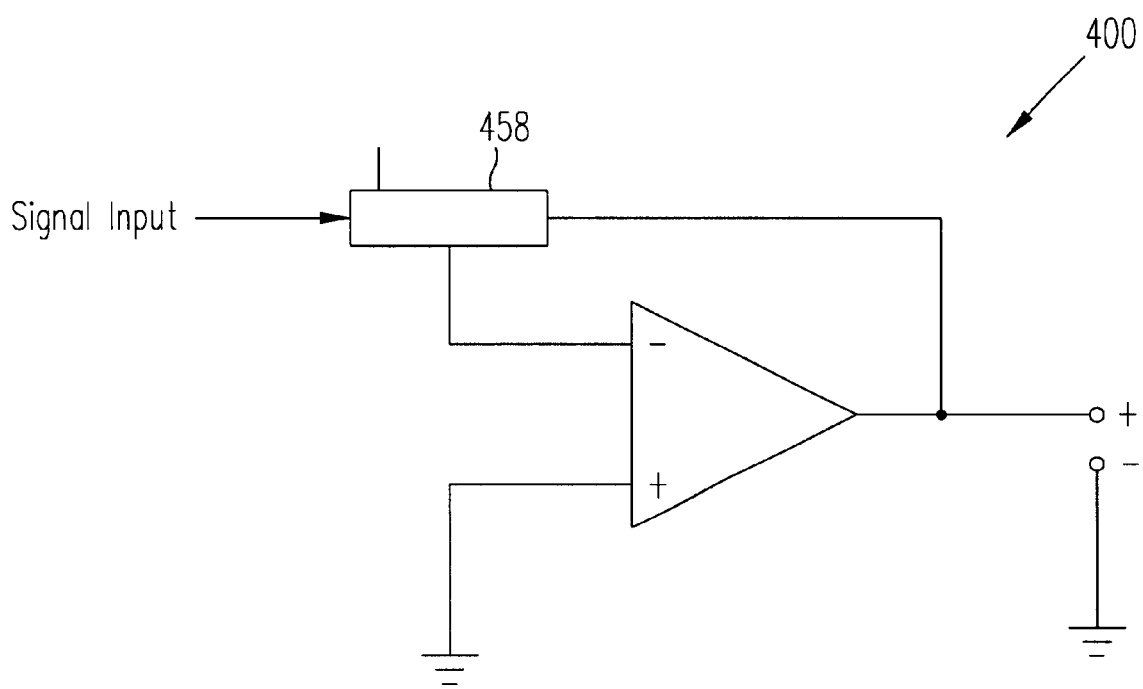
FIG. 7 is a simplified schematic showing an inverting amplifier in accordance with the present invention.
Figure 8:
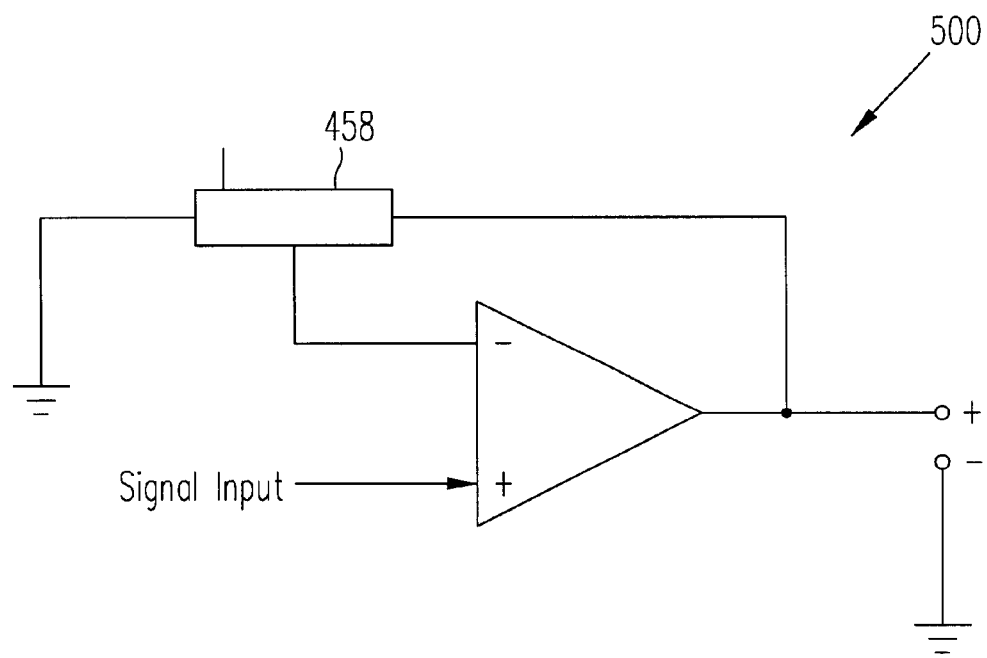
FIG. 8 is a simplified schematic showing a non-inverting amplifier in accordance with the present invention.

While the invention has been shown and described in detail, with respect to amplifier circuits formed with differential operational amplifiers, it should be understood that the same may work equally as well with other types of amplifier configurations employing the adjustment circuit 458, such as inverting amplifier 400 shown in FIG. 7 or a non-inverting amplifier 500 shown in FIG. 8, for adjusting gain. Moreover, all of the aforementioned amplifiers and switches may be formed employing BiCMOS or CMOS technology. Therefore, the breadth of the present invention should not be determined with respect to the above-described exemplary embodiments. Rather, the breadth of the present invention should be determined with respect to the claims recited below, including the full scope of equivalents thereof.

What is claimed is:

1. A circuit, comprising:
    an operational amplifier having first and second inputs and first and second outputs;
    first and second resistor networks; and
    first and second switching networks, with said first switching network connected between said first resistor network and said first input and said second switching network being connected between said second resistor network and said second input, wherein said first and second resistor networks each includes a feedback resistor and an input resistor, with said input resistor including a primary input resistor and a plurality of input adjustment resistors connected in series with said primary input resistor, with the input resistors of said first resistor network being coupled to said first input and the input resistor of said second resistor network being coupled to said second input and the feedback resistor of said first resistor network being coupled between said first output and said first input, and the feedback resistor of said second resistor network being coupled between said second output and said second input.

2. The circuit as recited in claim 1 wherein said feedback resistor includes a primary feedback resistor and a plurality of feedback adjustment resistors connected in series with said primary feedback resistor.

3. The circuit as recited in claim 1 wherein said feedback resistor and said input resistor define a gain, wherein said feedback resistor includes a primary feedback resistor and a quantity of feedback adjustment resistors connected in series with said primary feedback resistor, with a ratio of feedback adjustment resistors to said input adjustment resistors being directly proportional to said gain.

4. The circuit as recited in claim 1 wherein said first and, second switching networks each including a plurality switches each of which includes a signal input and a signal output, with the signal outputs of switches of said first switching network being connected in common with said first input and each of the inputs of said switches of said first switching network being connected to one of the input adjustment resistors of said first resistor network, and the signal outputs of switches of said second switching network being connected in common with said second input and each of the inputs of said switches of said second switching network being connected to one of the input adjustment resistors of said second resistor network.

5. The circuit as recited in claim 1 wherein said switching network includes a plurality switches each of which includes a signal input and a signal output, with the signal outputs of a subset of said plurality of switches being connected in common with said first input and each of the inputs of said subgroup of said plurality of switches being connected in to one of said feedback adjustment resistors.

6. A method for establishing performance characteristics of an operational amplifier of the type having an input, an output, an input resistor connected to said input and a feedback resistor connected between said input and said output, said method comprising:

concurrently varying a resistance associated with both said input resistor and said feedback resistor, wherein said amplifier includes an additional input, an additional output, an additional input resistor and an additional feedback resistor, with said additional input resistor connected to said additional input and said additional feedback resistor connected between said additional output and said additional input with said concurrently varying including concurrently varying said includes concurrently varying both of said input and feedback resistors and both said additional input and said additional feedback resistors to establish a gain, G, of said operational amplifier, and said input resistor includes a primary input resistor and a plurality of adjustment resistors connected in series therewith, and further including providing a plurality switches each of which includes a control input, a signal input and a signal output, with the signal outputs of switches of said first switching network being connected in common with said input and each of the inputs of said switches of said first switching network being connected to one of the input adjustment resistors, and concurrently varying including allocating control signals to said control input to selectively isolate said adjustment resistors from said input.

7. A method for establishing performance characteristics of an operational amplifier of the type having an input, an output, an input resistor connected to said input and a feedback resistor connected between said input and said output, said method comprising:

concurrently varying a resistance associated with both said input resistor and said feedback resistor, wherein said amplifier includes an additional input, an additional output, an additional input resistor and an additional feedback resistor, with said additional input resistor connected to said additional input and said additional feedback resistor connected between said additional output and said additional input with said concurrently varying including concurrently varying said includes concurrently varying both of said input and feedback resistors and both said additional input and said additional feedback resistors to establish a gain, G, of said operational amplifier, and said feedback resistor includes a primary feedback resistor and a plurality of feedback adjustment resistors connected in series therewith, and further including providing a plurality switches each of which includes a control input, a signal input and a signal output, with the signal outputs of switches of said first switching network being connected in common with said input and each of the inputs of said switches of said first switching network being connected to one of the feedback adjustment resistors, and concurrently varying including allocating control signals to said control input to selectively isolate said adjustment resistors from said input.

8. The method as recited in claim 6 further including a step of varying said input and feedback resistors independent of varying said additional input and feedback resistors.

9. The method as recited in claim 7 further including a step of varying said input and feedback resistors independent of varying said additional input and feedback resistors.

10. The circuit as recited in claim 1 wherein the primary input resistor of at least one of the first and second resistor networks has a value R associated therewith, and wherein the input adjustment resistors of the at least one of the first and second resistor networks has a value r associated therewith, with r being in the range of R/100 to R/1000, inclusive.

11. The circuit as recited in claim 2 wherein the primary feedback resistor has a value R associated therewith, and the feedback, adjustment resistors have a value r associated therewith, with r being in the range of R/100 to R/10000, inclusive.

* * * * *

UNITED STATES PATENT AND TRADEMARK OFFICE
CERTIFICATE OF CORRECTION

PATENT NO.    : 6,362,684 B1
DATED         : March 26, 2002
INVENTOR(S)   : Klein et al.

It is certified that error appears in the above-identified patent and that said Letters Patent is hereby corrected as shown below:

Column 9,
Line 12, "said first and," should be -- said first and --

Column 10,
Line 53, "feedback," should be -- feedback --
Line 54, "range of R/100 to R/10000," should be -- range of R/100 to R/1000, --

Signed and Sealed this

Twenty-fourth Day of September, 2002

*Attest:*

*Attesting Officer*

JAMES E. ROGAN
*Director of the United States Patent and Trademark Office*